(12) United States Patent
Zhixu et al.

(10) Patent No.: US 7,379,002 B1
(45) Date of Patent: May 27, 2008

(54) METHODS AND APPARATUS FOR A MULTI-MODE ANALOG-TO-DIGITAL CONVERTER

(75) Inventors: Zhou Zhixu, Gilbert, AZ (US); Julian Aschieri, Tempe, AZ (US); Gerald P. Miaille, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/639,676

(22) Filed: Dec. 15, 2006

(51) Int. Cl.
*H03M 3/00* (2006.01)
(52) U.S. Cl. ...................... 341/143; 341/155
(58) Field of Classification Search ......... 341/130–155
See application file for complete search history.

(56) References Cited

U.S. PATENT DOCUMENTS 5,345,342 A * 9/1994 Abbott et al. ............... 360/48
6,498,819 B1 * 12/2002 Martin ...................... 341/143
7,205,918 B2 * 4/2007 Niederdrank et al. ....... 341/143

OTHER PUBLICATIONS

Markus, Janos, et al, Theory and Application of Incremental ΔΣ Converters, IEEE Transactions on Circuits and Systems—I: Regular Papers vol. 51; No. 4, Apr. 2004.

* cited by examiner

*Primary Examiner*—Lam T. Mai
(74) *Attorney, Agent, or Firm*—Ingrassia, Fisher & Lorenz, P.C.

(57) ABSTRACT

A multi-mode analog-to-digital converter includes a delta-sigma analog-to-digital converter circuit configured to receive the analog input and produce a digital bit-stream associated therewith, the delta-sigma analog-to-digital converter including at least one integrator configured to reset to an initial state in response to a reset signal A digital filter circuit is configured to receive the digital bit-stream and produce two filtered outputs derived from the digital bit-stream. During one mode (e.g., a DC mode) the delta-sigma analog-to-digital converter circuit is configured to receive the reset signal and produce the digital bit-stream for a predetermined number of clock cycles, and the digital output corresponds to the first filtered output. In another mode (e.g., an AC mode), the delta-sigma analog-to-digital converter is configured to continuously produce the bit-stream, and the digital output corresponds to the second filtered output.

19 Claims, 2 Drawing Sheets

METHODS AND APPARATUS FOR A MULTI-MODE ANALOG-TO-DIGITAL CONVERTER

TECHNICAL FIELD

The subject matter described herein generally relates to analog-to-digital converters, and more particularly relates to analog-to-digital converters used for conversion of both AC and DC analog signals.

BACKGROUND

In many integrated circuits applications, both AC and DC signals are converted to digital form using dedicated analog-to-digital converters (ADC)—i.e., one ADC for AC signals, and another ADC for DC signals. The use of dedicated ADCs is necessitated by the very different nature of the signals themselves. AC signals such as audio signals or RF signals vary significantly over a short period of time, but are generally contained within a specified frequency range. In such applications, the required performance of the ADC relates to signal-to-noise ratio, dynamic range, and the like, while offset and gain errors are tolerable. Over-sampled sigma-delta noise shaping ADCs are often used in this type of application.

DC signals, in contrast, do not vary significantly over a short period of time, and include such signals as battery voltage, charging current, digital-to-analog converter (DAC) output voltage under calibration, and the like. In such applications, where low offset and gain error are desired, low speed Nyquist rate ADCs (SAR, dual slope, etc.) or oversampled incremental ADCs are often used. Incremental ADCs provide precision DC measurement (i.e., greater than 16 bit), but the standard sigma-delta noise-shaping ADC can not be directly used as an incremental ADC.

Accordingly, it is desirable to provide an ADC circuit that can be used for processing both AC and DC signals. Other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the various embodiments may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the scope or application of possible embodiments. Furthermore, there is no intention to be bound by any expressed or implied theory presented in the preceding technical field, background, brief summary or the following detailed description.

Various embodiments may be described herein in terms of functional and/or logical block components and various processing steps. It should be appreciated that such block components may be realized by any number of hardware, software, and/or firmware components configured to perform the specified functions. For the sake of brevity, conventional techniques and components related to analog and digital circuits, filters, and the like are not described in detail.

The terms "first," "second," "third," "fourth" and the like in the description and the claims, if any, may be used for distinguishing between similar elements and not necessarily for describing a particular sequential or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The terms "left," right," "in," "out," "front," "back," "up," "down," and other such directional terms are used to describe relative positions, not necessarily absolute positions in space. The term "exemplary" is used in the sense of "example," rather than "ideal."

In general, a multi-mode analog-to-digital converter (ADC) in accordance with various embodiments is configured to be selectively used as a standard noise-shaping ADC for AC signals, or as an incremental ADC for DC signals, thus combining both functions in a single circuit and saving power and semiconductor component space. A multi-mode ADC in accordance with one embodiment includes two coupled circuits: the ADC circuit 100 of FIG. 1, and the filter circuit 200 of FIG. 2, both of which will now be described.

Figure 1:
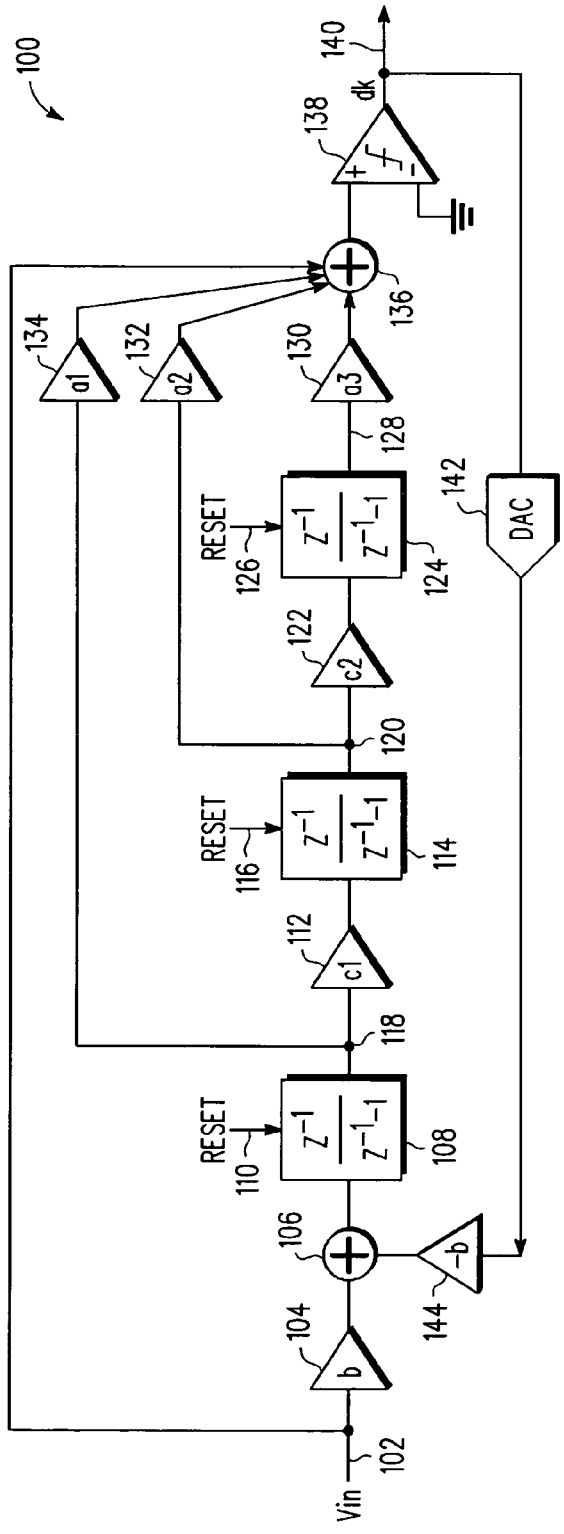
FIG. 1 is an analog-to-digital converter (ADC) circuit in accordance with one embodiment.

FIG. 1 presents an exemplary ADC circuit (or simply "circuit") 100 in accordance with one embodiment. In general, circuit 100 receives an analog input signal $V_{in}$ 102, and produces a digital output $d_k$ 140 responsive to $V_{in}$, which may be an AC or DC signal. For the purposes of clarity, clock signals, control lines, and reference signals (e.g., for DAC 142) are not illustrated in this figure.

Circuit 100 falls within the general class of sigma-delta modulators in that it evaluates the input signal 102, measures the error (via summer 106), integrates the error (via integrators 108, 114, and 124), then compensates for that error to produce an output (140). The output $d_k$ 140 is a bit stream (i.e., a one-bit serial signal) whose mean output converges to the value of input 102. The input 102 is oversampled to reduce the noise in the band of interest, while noise at high frequencies (e.g., quantization noise) is filtered as described in further detail below. Thus, such sigma-delta modulators are referred to as "noise shaping" modulators.

Unlike conventional Nyquist rate ADCs, sigma-delta converters generate a stream of digital samples whose pulse density is a measure of the analog input. For example, in an application with a reference voltage of 2.5 V, where a digital "1" represents 2.5V and a "0" represents −2.5V, a bit stream $d_k$ of 10111 represents an average voltage of (2.5−2.5+2.5+2.5+2.5)/5=1.5V.

The specific topology shown in FIG. 1 is a third-order cascade-of-integrators feed-forward (CIFF) ADC, also referred to as an "incremental" ADC. Circuit 100 includes three integrators—integrators 108, 114, and 124 (annotated in Z-transform notation)—configured in a feed-forward manner and leading to summer 136. Each integrator 108, 114, and 124 has an associated reset signal 110, 116, and 126. These reset signals are applied (e.g., by external control circuitry, not illustrated) to force the integrator to an initial state (e.g., a zero state). While a third-order CIFF circuit is illustrated, other configurations may also be used.

Input voltage 102 is coupled to a buffer 104 (e.g., buffered op-amp, or the like), having a buffer coefficient b, which is coupled to summing node (or "summer") 106. The output of summer 106 is applied to integrator 108. The output of integrator 108 is coupled to buffer 112 (having a coefficient c1), which is coupled to integrator 114. The output of integrator 114 is coupled to buffer 122 (having a coefficient c2), which in turn is coupled to the final integrator 124.

The outputs of integrators 108, 114, and 124 (i.e., signals 118, 120, and 128, respectively) are coupled to buffers 134, 132, and 130 (having coefficients a1, a2, and a3), the outputs of which are summed in summer 136 along with input voltage 102. The use of weighted feedforward paths in this way helps to provide system stability. Values for b, c1, c2, a1, a2, a3 may be selected to achieve the desired stability and system performance, given a particular clock frequency. These coefficient values are typically derived based on the targeted noise transfer and signal transfer functions, and are a well known aspect of delta-sigma modulator design.

The output of summer 136 is coupled to one input of comparator 138, which produces a bit stream at output 140 ($d_k$). A feedback loop including digital-to-analog converter (DAC) 142 and buffer 144 (having coefficient that is opposite in sign but equal in magnitude of that of buffer 104) is coupled between output 140 and summer 106. As with other forms of delta-sigma modulators, the sum of this bit stream (where a digital "1" corresponds to a positive reference voltage, and a digital "0" corresponds to a negative reference voltage) converges to a mean value corresponding to the voltage input 102. The relationship between input 102 and output 140 (dk) is given by:

$$Vin = \frac{6 * Vref}{(n-2)(n-1)n} * \sum_{m=0}^{n-1}\sum_{l=0}^{m-1}\sum_{k=0}^{l-1} dk$$

where n is the number of clock cycles, and Vref is a suitable reference voltage.

Figure 2:
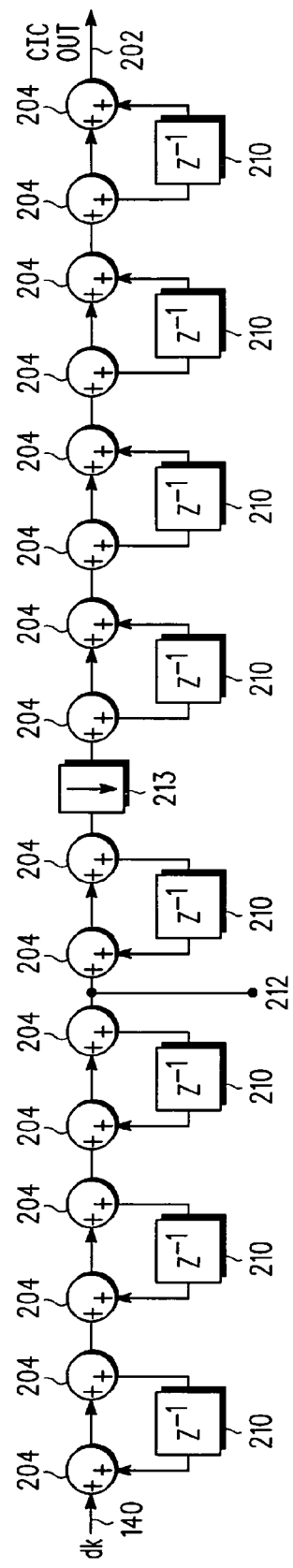
FIG. 2 is an exemplary filter circuit used in conjunction with the circuit shown in FIG. 1.

The output of comparator 138 is applied to a digital filter such as that shown in FIG. 2. The purpose of this filter is to downsample the bitstream received from comparator while filtering out various forms of noise. In this embodiment, circuit (or "filter") 200 is a $4^{th}$-order cascaded integrator-comb (CIC) filter configured to generate the desired digital value (output 202) corresponding to analog input voltage 102. As is known in the art, a CIC filter is an implementation of a narrowband lowpass filter and is often used for decimation, anti-aliasing, and/or interpolation. It generally operates by adding a delayed version of the signal to itself, causing a form of constructive and destructive interference. The resulting frequency response exhibits a comb-like series of regularly-spaced spikes. Such filters are often used in applications having a large excess sample rate—i.e., applications where the sample rate is much larger than the bandwidth occupied by the signal.

Circuit 200 illustrated in FIG. 2 implements a decimation filter, and generally includes a series of summers 204, a series of ideal integrators (or "filter integrators") 210, a series of ideal differentiators (or "combs") 211, and a decimation operator 213 positioned therebetween. Each integration stage (i.e., combination of summer 204 and integrator 210) of circuit 200 is a one-pole filter with a unity feedback coefficient, and operates at a predetermined clock frequency.

Each bit of bitstream $d_k$ 140 progress through integrators 210 and summers 204 in the conventional manner, while decimation operator 213 functions to discard all by the Rth sample received from output 140, resulting in a reduced sampling rate. The value of R used in a particular application will depend on a number of factors, including sampling rate, etc., as is known in the art. Differentiators 211 function in a manner that is opposite that of integrators 210, but operate on the reduced bit stream produced by decimation operator 213.

As mentioned above, the illustrated embodiment may be used in one of two modes: as a standard noise-shaping ADC for processing AC signals ("Standard" or "AC" mode), and as an incremental ADC for processing DC signals ("Incremental" or "DC" mode). Thus, unlike conventional CIC filters, which are used to convert AC signals, circuit 200 has two outputs: output 202, which is used in the AC mode, and output 212, which is used in the DC mode as described in further detail below.

Referring to FIGS. 1 and 2, in order to utilize circuits 100 and 200 in the incremental mode, at the beginning of a new conversion step each integrator 108 is reset via application of reset signals 110, 116, and 126. These reset signals may be received, for example, from a controller or other microprocessor (now shown). A fixed number of integration steps (clock cycles) n are then performed, depending upon the desired accuracy. This number, which may be configurable, varies depending upon the application and desired accuracy, and may range from two to any suitably large number of clock cycles.

As the integration steps proceed, the analog DC input signal 102 is incremented through integrators 108, 114, and 124, and a bit stream is produced at output 140 as described above. The average value of this bit stream converges to the magnitude of input signal 102. The output of the final integrator 124 is frozen after the desired number of cycles (e.g., by stopping the clock), and the output 212 of filter 200 is used to determine the correct digital representation of input signal 102.

As shown in FIG. 2, output 212 is positioned after a subset of integrators 210—in this case, three such integrators. Because the circuit shown in FIG. 1 is $3^{rd}$ order, it desirable to use only the first three integrators 210 of CIC filter 200 to properly filter the signal. Furthermore, by doing so, the conversion time in incremental mode is reduced. Thus, with reference to the equation for $V_{in}$ shown above, the triple integration in this equation is performed by the first three integrators 210 in circuit 200. Since the number of clock cycles, n, is known, the digital representation of $V_{in}$ is also known. Because signal-to-noise ratio and other AC-related metrics are of little importance to DC signals, there is little disadvantage in using only three of the integrators 210 to derive the digital signal. At the same time, offset and gain errors are reduced.

In order to utilize circuits 100 and 200 in standard mode (i.e., for AC signals), it is not necessary to reset integrators 108, 114, and 124, and thus the integrators in circuit 100 are allowed to run continuously over time. At the same time, output 202 of filter 200 is used to determine the correct digital representation of input signal 102. As is desirable when converting AC signals, the resulting output 202 has a higher signal-to-noise ratio and better dynamic range than that of output 212. Output 202 is more susceptible to gain and offset errors, which are not as important in an AC context as they are in the DC context.

During normal operation, it will often be desirable to use the combined ADC in standard mode to measure AC signals for a period of time, then interrupt its operation to use it in incremental mode to process high-precision DC samples. In one embodiment, for example, the combined ADC is used in normal mode to measure a 1 KHz-500 KHz GSM/WCDMA AC signal, and is used in incremental mode to measure a calibration signal for a 14 bit DAC. The range of embodiments is not so limited, however, and may be used in a variety of contexts.

Figure 3:
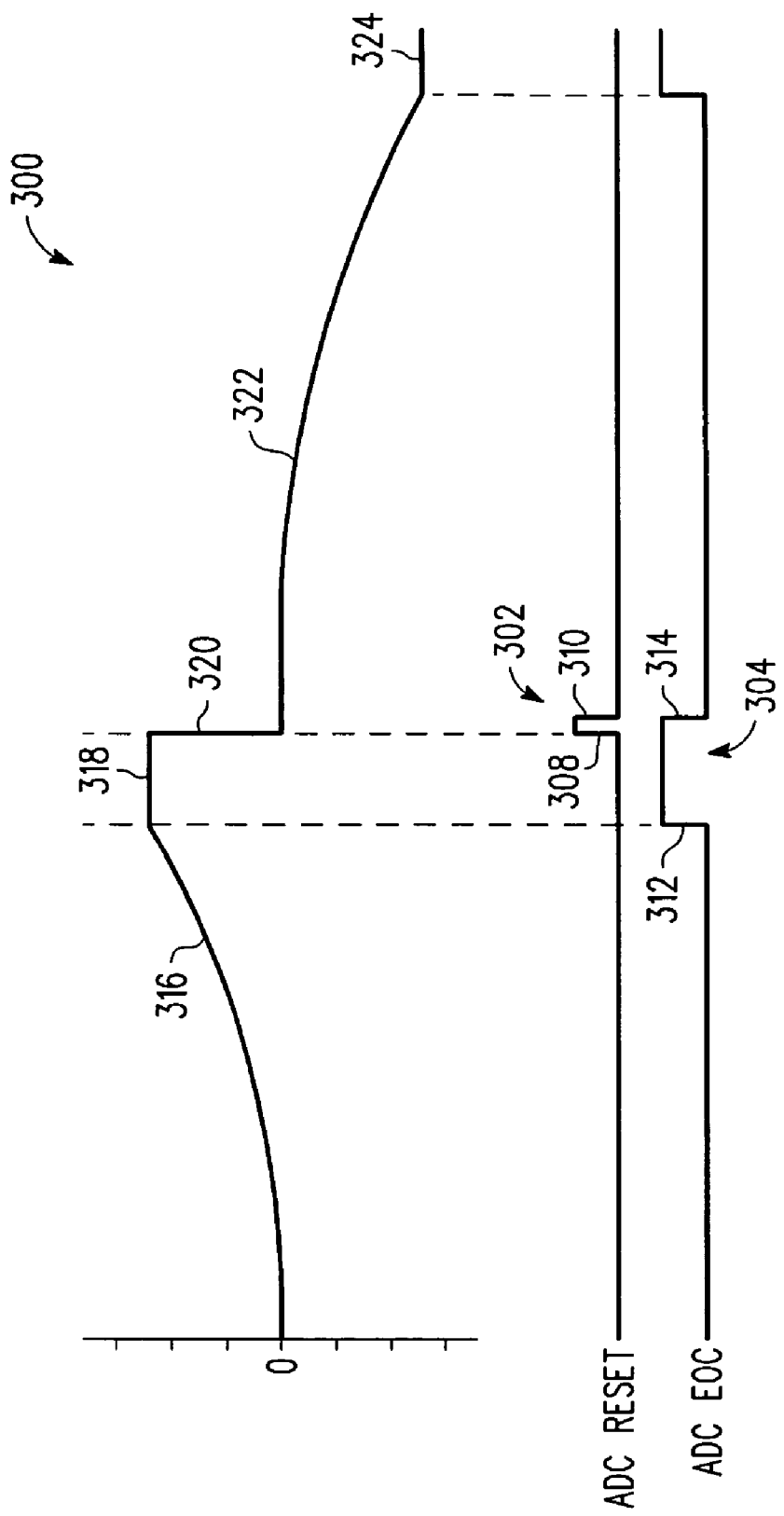
FIG. 3 is waveform depicting operation of the combined circuits of FIGS. 1 and 2 in a incremental mode.

FIG. 3 plots example operation of circuits 100 and 200 in incremental ADC mode. The output 212, an ADC RESET signal 302, and an ADC end-of-convert (EOC) signal 304 are simultaneously plotted. ADC RESET signal 302 is characterized by a leading edge 308 and trailing edge 310, and corresponds to the application of reset signals 110, 116, and 126 in FIG. 1. ADC EOC signal 304 is characterized by a leading edge 312, and trailing edge 314, where trailing edge 314 generally corresponds to trailing edge 310.

In this example plot, it is assumed that an ADC RESET has occurred, and that a positive DC voltage has been applied to input 102. As shown, the output 212 gradually rises from an initial value (in this illustration, zero) to a positive value in region 316 as the number of clock cycles increase. This positive value converges to the analog input 102 of FIG. 1. An ADC EOC signal pulse is then applied, at which time the clock is slopped, and the value of output 212 is read within region 318 (where it remains constant). Next, an ADC RESET pulse is applied, and, in this example, a negative DC voltage is applied to input 102. The output 212 resets (region 320), then decreases in region 322 until it is frozen to a final value in region 324 upon application of a subsequent ADC EOC pulse.

Thus, what has been disclosed is a multi-mode analog-to-digital converter that can efficiently process both AC and DC input signals. In accordance with one embodiment, the digital filter and ADC circuitry are combined in a single semiconductor device, thus reducing the chip area normally required for dedicated ADCs. At the same time, power consumption is reduced.

In one embodiment, a multi-mode analog-to-digital converter configured to receive an analog input and produce a digital output corresponding to the analog input, comprises: a delta-sigma analog-to-digital converter circuit configured to receive the analog input and produce a digital bit-stream associated therewith, the delta-sigma analog-to-digital converter circuit including at least one integrator configured to reset to an initial state in response to a reset signal; and a digital filter circuit configured to receive the digital bit-stream, the digital filter circuit configured to produce a first filtered output and a second filtered output derived from the digital bit-stream; wherein, during a first mode, the delta-sigma analog-to-digital converter circuit is configured to receive the reset signal and produce the digital bit-stream for a predetermined number of clock cycles, and wherein the digital output corresponds to the first filtered output; and wherein, during a second mode, the delta-sigma analog-to-digital converter circuit is configured to continuously produce the digital bit-stream, and wherein the digital output corresponds to the second filtered output. In one embodiment, the first mode is configured to convert a DC signal, and the second mode is configured to convert an AC signal.

In one embodiment, the delta-sigma analog-to-digital converter circuit comprises a cascade-of-integrators feed-forward (CIFF) analog-to-digital converter. In a particular embodiment, the CIFF is a third-order CIFF. The digital filter circuit may comprise a cascaded-integrator-comb (CIC) filter. The CIC filter may include a series of integrators, wherein the first filtered output corresponds to the end of a subset of the series of integrators. In one embodiment, the analog-to-digital converter is an n-th order converter, and the subset of the series of integrators includes n integrators.

A method of converting an analog input to a digital output includes: providing a delta-sigma analog-to-digital converter circuit configured to receive the analog input and produce a digital bit-stream associated therewith, the delta-sigma analog-to-digital converter circuit including at least one integrator configured to reset to an initial state in response to a reset signal; providing a digital filter circuit configured to receive the digital bit-stream, the digital filter circuit configured to produce a first filtered output and a second filtered output derived from the digital bit-stream; selecting a mode of operation, wherein the mode of operation is selected from the group consisting of an AC mode and a DC mode; if the DC mode is selected: applying the reset signal, instructing the delta-sigma converter circuit to produce the digital bit-stream for a predetermined number of clock cycles, and deriving the digital output from the first filtered output; if the AC mode is selected: producing the digital bit-stream continuously and deriving the digital output from the second filtered output.

In one embodiment, providing the delta-sigma analog-to-digital converter circuit includes providing a cascade-of-integrators feed-forward (CIFF) analog-to-digital converter, and wherein instructing the delta-sigma converter circuit includes instructing the CIFF analog-to-digital converter to produce the digital bit-stream for a predetermined number of clock cycles. In another, providing the delta-sigma analog-to-digital converter circuit includes providing a third-order CIFF. In one embodiment, the second filtered output corresponds to the end of a series of integrators, and wherein first filtered output corresponds to the end of a subset of the series of integrators. In another embodiment, the delta-sigma analog-to-digital converter circuit is a third-order converter, and wherein the subset of the series of integrators includes three integrators in the series of integrators.

A multi-mode analog-to-digital converter configured to receive an analog input and produce a digital output corresponding to the analog input includes: a cascade of integrators feed-forward (CIFF) analog-to-digital converter circuit configured to receive the analog input and produce a digital bit-stream associated therewith, the CIFF analog-to-digital converter circuit including a plurality of integrators, each configured to reset to an initial state in response to a corresponding reset signal; and a cascaded-integrator comb (CIC) filter circuit configured to receive the digital bit-stream, produce a first filtered output after a first number of filter integrators, and produce a second filtered output after a second number of filter integrators; wherein the CIFF analog-to-digital converter circuit and the CIC filter circuit are configured to selectively operate in an incremental mode for conversion of DC signals, and a normal mode for conversion of AC signals; wherein, during the incremental mode, the CIFF analog-to-digital converter circuit is configured to receive the corresponding reset signals and produce the digital bit-stream for a predetermined number of clock cycles, and wherein the digital output corresponds to the first filtered output of the CIC filter circuit; and wherein, during the normal mode, the CIFF analog-to-digital converter circuit is configured to continuously produce the digital bit-stream, and wherein the digital output corresponds to the second filtered output of the CIC filter circuit. In one embodiment, the CIFF analog-to-digital converter circuit includes a third-order CIFF. In a particular embodiment, the first number of filter integrators comprises three filter integrators, and the second number of filter integrators comprises eight filter integrators. The predetermined number of clock cycles may be configurable by the controller. The CIFF analog-to-digital converter and the CIC filter circuit may be integrated into a single semiconductor device. The clock may terminate after the predetermined number of clock cycles in response to an end-of-convert signal.

While at least one example embodiment has been presented in the foregoing detailed description, it should be appreciated that a vast number of variations exist. It should also be appreciated that the example embodiment or embodiments described herein are not intended to limit the scope, applicability, or configuration of the various embodiments in any way. Rather, the foregoing detailed description will provide those skilled in the art with a convenient road map for implementing the described embodiment or embodiments. It should be understood that various changes can be made in the function and arrangement of elements without departing from the scope set forth in the appended claims and the legal equivalents thereof.

What is claimed is:

1. A multi-mode analog-to-digital converter configured to receive an analog input and produce a digital output corresponding to the analog input, comprising:
   a delta-sigma analog-to-digital converter circuit configured to receive the analog input and produce a digital bit-stream associated therewith, the delta-sigma analog-to-digital converter circuit including at least one integrator configured to reset to an initial state in response to a reset signal; and
   a digital filter circuit configured to receive the digital bit-stream, the digital filter circuit configured to produce a first filtered output and a second filtered output derived from the digital bit-stream;
   wherein, during a first mode, the delta-sigma analog-to-digital converter circuit is configured to receive the reset signal and produce the digital bit-stream for a predetermined number of clock cycles, and wherein the digital output corresponds to the first filtered output; and
   wherein, during a second mode, the delta-sigma analog-to-digital converter circuit is configured to continuously produce the digital bit-stream, and wherein the digital output corresponds to the second filtered output;
   wherein the first and second modes are selectively activated such that the first mode is active when the analog input is a DC signal, and the second mode is active when the analog input is an AC signal.

2. The multi-mode analog-to-digital converter of claim 1, wherein the delta-sigma analog-to-digital converter circuit comprises a cascade-of-integrators feed-forward (CIFF) analog-to-digital converter.

3. The multi-mode analog-to-digital converter of claim 2, wherein the CIFF is a third-order CIFF.

4. The multi-mode analog-to-digital converter of claim 1, wherein the digital filter circuit comprises a cascaded-integrator-comb (CIC) filter.

5. The multi-mode analog-to-digital converter of claim 4, wherein the CIC filter includes a series of integrators, and wherein the first filtered output corresponds to the end of a subset of the series of integrators.

6. The multi-mode analog-to-digital converter of claim 5, wherein the analog-to-digital converter is an n-th order converter, and the subset of the series of integrators includes n integrators.

7. The multi-mode analog-to-digital converter of claim 1, wherein the first mode is configured to convert a DC signal, and the second mode is configured to convert an AC signal.

8. A method of converting an analog input to a digital output comprising:
   providing a delta-sigma analog-to-digital converter circuit configured to receive the analog input and produce a digital bit-stream associated therewith, the delta-sigma analog-to-digital converter circuit including at least one integrator configured to reset to an initial state in response to a reset signal;
   providing a digital filter circuit configured to receive the digital bit-stream, the digital filter circuit configured to produce a first filtered output and a second filtered output derived from the digital bit-stream;
   selecting a mode of operation, wherein the mode of operation is selected from the group consisting of an AC mode and a DC mode;
   if the DC mode is selected: applying the reset signal, instructing the delta-sigma converter circuit to produce the digital bit-stream for a predetermined number of clock cycles, and deriving the digital output from the first filtered output;
   if the AC mode is selected: producing the digital bit-stream continuously and deriving the digital output from the second filtered output.

9. The method of claim 8, wherein providing the delta-sigma analog-to-digital converter circuit includes providing a cascade-of-integrators feed-forward (CIFF) analog-to-digital converter, and wherein instructing the delta-sigma converter circuit includes instructing the CIFF analog-to-digital converter to produce the digital bit-stream for a predetermined number of clock cycles.

10. The method of claim 9, wherein providing the delta-sigma analog-to-digital converter circuit includes providing a third-order CIFF.

11. The method of claim 8, wherein providing the digital filter circuit includes providing a cascaded-integrator-comb (CIFF) filter.

12. The method of claim 8, wherein the second filtered output corresponds to the end of a series of integrators, and wherein first filtered output corresponds to the end of a subset of the series of integrators.

13. The method of claim 12, wherein the delta-sigma analog-to-digital converter circuit is a third-order converter, and wherein the subset of the series of integrators includes three integrators in the series of integrators.

14. A multi-mode analog-to-digital converter configured to receive an analog input and produce a digital output corresponding to the analog input, comprising:
   a cascade-of-integrators feed-forward (CIFF) analog-to-digital converter circuit configured to receive the analog input and produce a digital bit-stream associated therewith, the CIFF analog-to-digital converter circuit including a plurality of integrators, each configured to reset to an initial state in response to a corresponding reset signal; and
   a cascaded-integrator comb (CIC) filter circuit configured to receive the digital bit-stream, produce a first filtered output after a first number of filter integrators, and produce a second filtered output after a second number of filter integrators;
   wherein the CIFF analog-to-digital converter circuit and the CIC filter circuit are configured to selectively operate in an incremental mode for conversion of DC signals, and a normal mode for conversion of AC signals;

wherein, during the incremental mode, the CIFF analog-to-digital converter circuit is configured to receive the corresponding reset signals and produce the digital bit-stream for a predetermined number of clock cycles, and wherein the digital output corresponds to the first filtered output of the CIC filter circuit; and wherein, during the normal mode, the CIFF analog-to-digital converter circuit is configured to continuously produce the digital bit-stream, and wherein the digital output corresponds to the second filtered output of the CIC filter circuit.

15. The multi-mode analog-to-digital converter of claim 14, wherein the CIFF analog-to-digital converter circuit includes a third-order CIFF.

16. The multi-mode analog-to-digital converter of claim 15, wherein the first number of filter integrators comprises three filter integrators, and the second number of filter integrators comprises eight filter integrators.

17. The multi-mode analog-to-digital converter of claim 14, wherein the predetermined number of clock cycles is configurable.

18. The multi-mode analog-to-digital converter of claim 14, wherein the CIFF analog-to-digital converter and the CIC filter circuit are integrated into a single semiconductor device.

19. The multi-mode analog-to-digital converter of claim 14, wherein a clock coupled to the CIFF analog-to-digital converter circuit is terminated after the predetermined number of clock cycles in response to an end-of-convert signal.

* * * * *